(12) United States Patent
Barth

(10) Patent No.: US 8,907,433 B2
(45) Date of Patent: Dec. 9, 2014

(54) THIN FILM WITH IMPROVED TEMPERATURE RANGE

(71) Applicant: Agilent Technologies, Inc., Loveland, CO (US)

(72) Inventor: Phillip W Barth, Loveland, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 92 days.

(21) Appl. No.: 13/631,614

(22) Filed: Sep. 28, 2012

(65) Prior Publication Data

US 2014/0091422 A1    Apr. 3, 2014

(51) Int. Cl.
*H01L 29/84* (2006.01)

(52) U.S. Cl.
USPC .............................. 257/415; 257/467; 438/48

(58) Field of Classification Search
USPC .............................. 257/414, 415, 467; 438/48
See application file for complete search history.

(56) References Cited

U.S. PATENT DOCUMENTS

| 5,772,322 A | * | 6/1998 | Burns et al. | 374/118 |
| 7,963,634 B2 | * | 6/2011 | Yokouchi | 347/54 |
| 2011/0107816 A1 | * | 5/2011 | Barth | 73/25.03 |

* cited by examiner

*Primary Examiner* — David Vu
*Assistant Examiner* — Brandon Fox

(57) ABSTRACT

A device and a method of forming the same are disclosed. The device comprises a substrate and a thin film. The substrate is characterized by a first coefficient of thermal expansion. The thin film is attached to a surface of the substrate, and is characterized by a second coefficient of thermal expansion. The thin film includes first and second layers in states of compression, and a third layer in a state of tension, the third layer being positioned between the first and second layers. The thin film is in a net state of tension within a temperature range.

20 Claims, 7 Drawing Sheets

71. Deposit a first layer of compressive thin film on a substrate surface.

72. Deposit a second layer of tensile thin film atop the first layer.

73. Deposit a third layer of compressive thin film atop the second layer.

74. Define the lateral extents of the composite thin film to expose a portion of the substrate, by means of photolithography and etching.

75. Etch into the exposed portion of the substrate to leave a suspended thin film microstructure over a cavity in the substrate.

Figure 5

THIN FILM WITH IMPROVED TEMPERATURE RANGE

BACKGROUND

Microstructure devices often incorporate a thin film disposed atop a substrate surface, the film being formed into a cantilever, bridge, membrane, or other similar structure suspended over a cavity etched into the substrate. In some cases, the thin film may encase a sensing element, or may intrinsically provide a sensing function. For example, a thin film thermal conductivity sensor, used to detect the thermal conductivity of gas in the output flow from a gas chromatograph may include a thin film bridge of silicon nitride suspended over a cavity in a silicon substrate, the thin film encasing a metal film resistor and thereby providing environmental passivation to the resistor.

A thin film in a microstructure must resist mechanical and thermal shock, and must survive large temperature excursions during fabrication, storage, shipping, and use of the microstructure. However, differences in the coefficient of thermal of expansion (CTE) between the thin film and the substrate on which it is supported present a challenge to the thin film's survival.

Typically the thin film is formed, by some combination of deposition and growth, on a surface of the substrate at one or more formation temperatures, typically high temperatures, while the resultant device is stored, shipped, and operated over a temperature range which may go above or below the formation temperature. The thin film incorporates stresses which are intrinsic to the film at its formation temperature, and is subjected to additional thermal stress due to any thermal expansion mismatch between the substrate and the thin film, or due to any thermal expansion mismatch between materials within the thin film, or due to any thermal expansion mismatch between the thin film and any elements disposed within or upon the thin film. Further, the thin film is subject to environmentally-induced mechanical stress from sources such as shaking, dropping, air currents, water flow, and the like, depending on the particular environment. When some combination of intrinsic stress, thermal stress, and mechanical stress exceeds the tensile strength of the thin film, it is subject to destructive failure in the form of cracking or breaking.

For example, when the substrate comprises silicon with a CTE of 3.7 parts per million per degree Kelvin ($CTE_{Si}$=3.7 ppm/° K) and the film comprises silicon nitride, with a coefficient of expansion of $CTE_{nitride}$=3.3 ppm/° K, the difference in CTEs between the thin film and the substrate is 0.2 ppm/° K, which difference can lead to mechanical failure of the film, either after the deposition when the film cools down, during shipping, or during the operation of the finished device. If the initial intrinsic stress in the film is zero at a deposition temperature of, for example, 300° C., and the substrate and thin film cool from the deposition temperature, to a room temperature of 25° C., the thin film could then be in a net state of compression. If a portion of the underlying support for the thin film is then removed to create a suspended structure, that structure is at risk of buckling at room temperature. The buckling may lead to localized rupture because the local bending involved in buckling creates localized tensile stress which exceeds the tensile strength of the thin film material. Further, if such a device is operated at a temperature higher than the deposition temperature, the thermal expansion mismatch can place the structure in a state of high tension, presenting a risk of rupture.

SUMMARY OF THE INVENTION

The invention includes a device comprising a substrate and a thin film structure. The substrate is characterized by a first CTE. The thin film is formed on a surface of the substrate, and is attached to that surface, and is characterized by a second overall CTE. The thin film includes first and second layers in states of compression at a reference temperature, and a third layer in a state of tension at the reference temperature, the third layer being positioned between those first and second layers. The thin film structure, if formed into a bridge or diaphragm, exerts a net tensile force on the substrate over a desired temperature range, while the exposed surfaces of the thin film remain in either compression or a mild state of tension over that temperature range.

In one aspect, the thin film comprises one of silicon nitride, plasma-enhanced chemical vapor deposited silicon nitride, low pressure chemical vapor deposited silicon nitride, plasma-enhanced chemical vapor deposited silicon dioxide, thermally grown silicon dioxide, and TEOS silicon dioxide.

In another aspect, the thin film comprises a cantilever attached to one edge of a cavity defined in the surface of the substrate. In yet another aspect, the cantilever includes an element having a composition different from the first, second and third layers of the thin film.

In another aspect, the thin film comprises a bridge suspended between two edges of a cavity defined in the surface of the substrate. In yet another aspect, the bridge includes an element having a composition different from the first, second and third layers of the thin film.

BRIEF DESCRIPTION OF THE DRAWINGS

FIG. 5 illustrates a method of fabrication an embodiment of the invention.

DETAILED DESCRIPTION

The meanings of terms used herein are the same as in their conventional engineering uses. For purposes of convenience in discussion herein, some of these terms are defined here as follows: A thin film is a film formed as a layer or layers, the total thickness of the film being typically less than five (5) micrometers (<5 μm). Stress is a measure of the force per unit area existing within a body, typically given in units of mega-Pascals (MPa). Compressive stress is stress which would tend to increase the length of a deformable body along an axis if the body were not constrained along that axis, and is conventionally presented by numbers less than zero. Compressive stress may be a response to an externally applied squeezing force applied to the body after fabrication, or it may be generated internally during or after the fabrication process. Compressive stress can potentially cause the deformable body to fail by buckling. A structure is in a state of compression if the structure experiences net compressive force.

Tensile stress is stress which would tend to decrease the length of a deformable body along an axis if the body were not constrained along that axis, and is conventionally presented by numbers greater than zero. Tensile stress may be a response to an externally applied pulling or stretching force, or it may be generated internally during or after the fabrication process. Tensile stress can potentially cause the structure to fail by rupture. A structure is in a state of tension if the structure experiences net tensile force. A structure is in a net state of tension if the combined effect of compressive stresses experienced by some portions of the structure and tensile stresses experienced by other portions of the structure is a state of tensile force exerted by the structure on its constraints. A stress riser is a region of non-uniformity, such as a notch, narrowing, inclusion, flaw, crack, or imperfection, in an otherwise uniform area of a mechanical element. A stress riser tends to result in increased local stress near the stress riser, often leading to breakage of the mechanical element at or near the stress riser. The overall CTE of a composite structure is the net increase in length of the structure in a given direction for a change in temperature, if the structure were unconstrained in free space, divided by the change in temperature of the structure.

Figure 1:
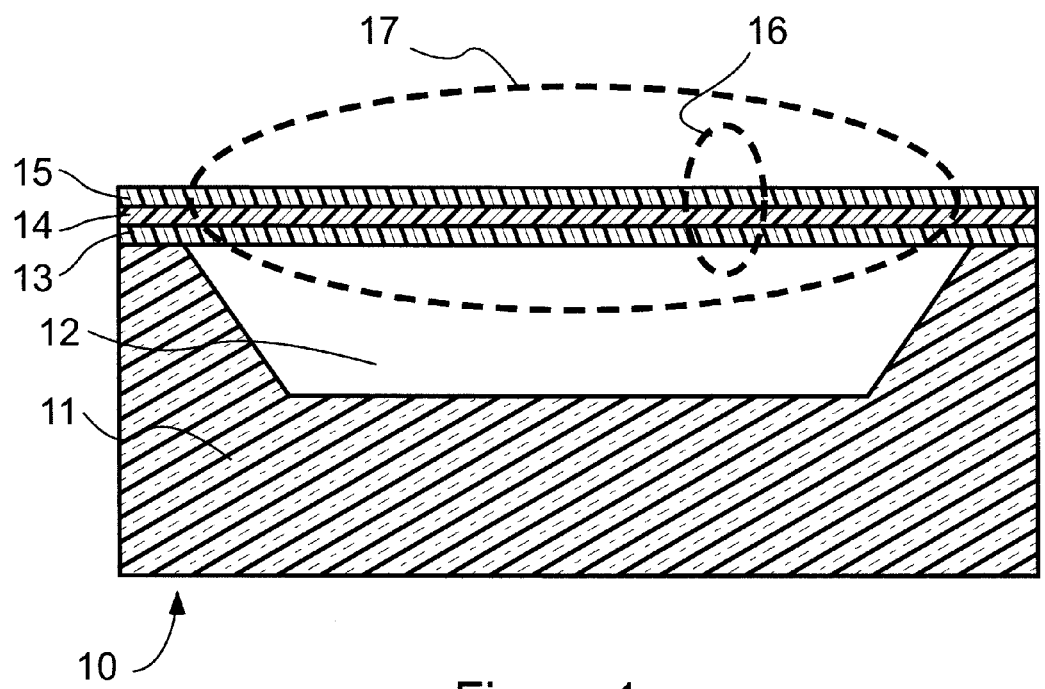
FIG. 1 illustrates a device according to one embodiment of the present invention.

The manner in which the present invention provides its advantages can be more easily understood with reference to FIGS. 1-4. FIG. 1 is a cross-sectional drawing illustrating a device 10 according to one embodiment of the invention. Device 10 includes a bridge structure 17 that is suspended over a cavity 12 in a substrate 11. The cavity is formed by etching substrate 11 to undercut thin film 16 after thin film 16 has been formed on a surface of substrate 11. Thin film 16 includes layers 13, 14, and 15. The overall CTE of thin film 16 is different from the CTE of substrate 11. Bridge structure 17 includes layers 13 and 15 in states of compression, and layer 14 in a state of tension disposed between layers 13 and 15. As will be discussed in more detail below, additional thin film elements may be included within the interior of thin film 16, or upon one or more surfaces of thin film 16. While bridge structure 17 is shown as being supported at two edges of cavity 12, other support arrangements can be utilized. For example, thin film 16 may be formed into a cantilever element supported at only one edge of cavity 12, or into a diaphragm element supported at all edges of cavity 12, or into some combination of these structures. Moreover, as will be discussed in more detail below, thin film 16 may be perforated.

Figure 2:
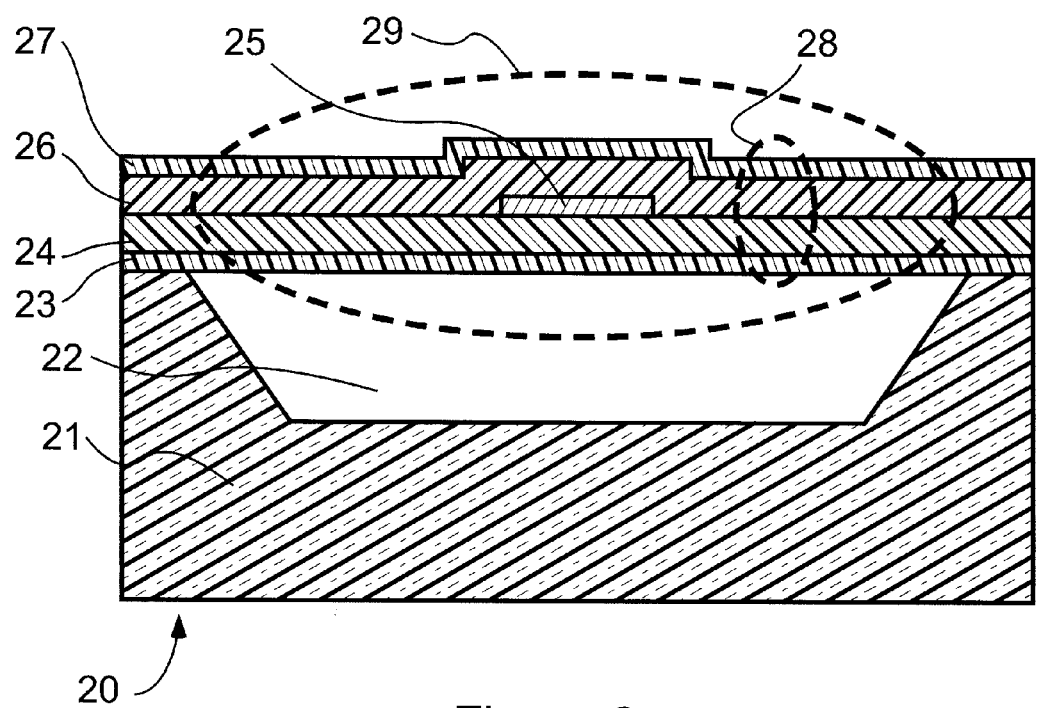
FIG. 2 illustrates a device according to another embodiment of the present invention.

FIG. 2 is a cross-sectional drawing illustrating a device 20 according to another embodiment of the invention. Substrate 21 has cavity 22 in a surface of substrate 21. Cavity 22 is spanned by a suspended bridge 29 comprising a thin film 28, having layers 23 and 27 in states of compression, and layers 24 and 26 in states of tension. Bridge 29 also includes element 25 which may be, for example, a metal film resistor.

Figure 3:
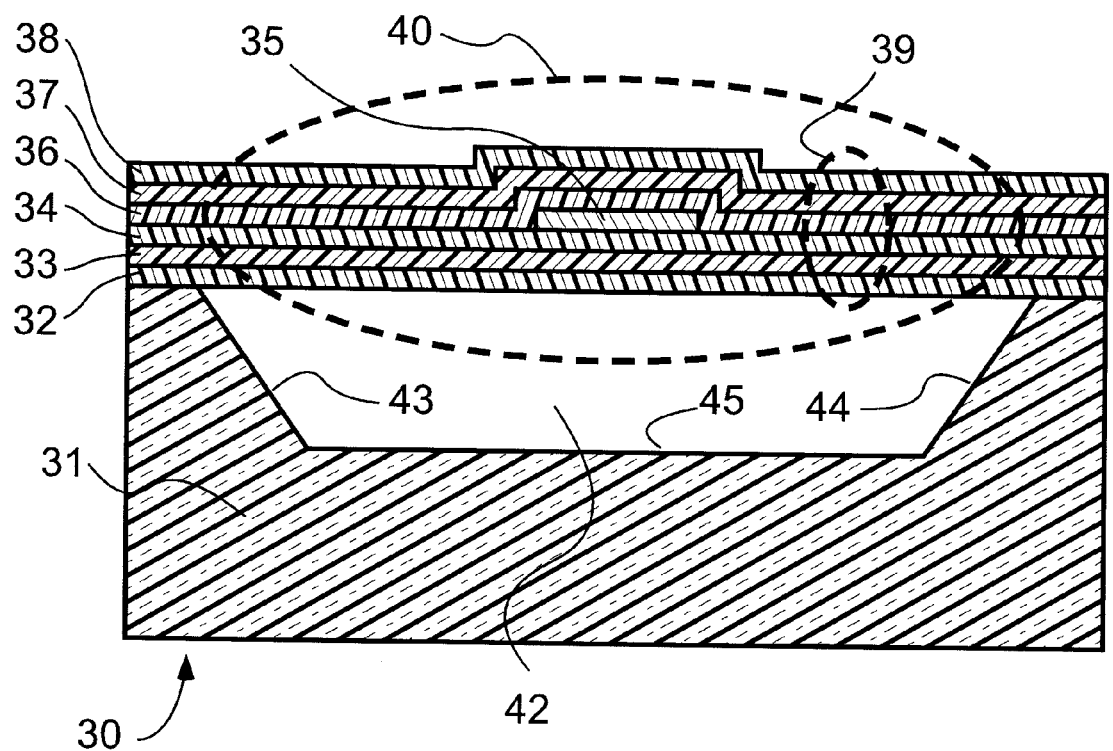
FIG. 3 illustrates a device according to yet another embodiment of the present invention.

FIG. 3 is a cross-sectional drawing illustrating a device 30 according to yet another embodiment of the invention. Substrate 31 has cavity 42 in the top surface of substrate 31. Substrate 31 is characterized by a first CTE. Cavity 42 is spanned by a suspended bridge 40. Suspended bridge 40 comprises a thin film 39 characterized by a second overall CTE that is different from the first CTE. Thin film 39 includes layers 32, 34, 36, and 38 in states of compression, and layers 33 and 37 in states of tension. Element 35 is encased in thin film 39 and may be, for example, a metal film resistor. Cavity 42 has sloping sidewalls 43 and 44 and flat bottom 45.

The layers making up thin film 39 may include materials such as silicon nitride, plasma-enhanced chemical vapor deposited silicon nitride, low pressure chemical vapor deposited silicon nitride, plasma-enhanced chemical vapor deposited silicon dioxide, thermally grown silicon dioxide, and tetraethylorthosilicate (TEOS)-based silicon dioxide. Element 35 may comprise a metal such as nickel, tungsten, titanium, permalloy, or platinum.

Figure 4:
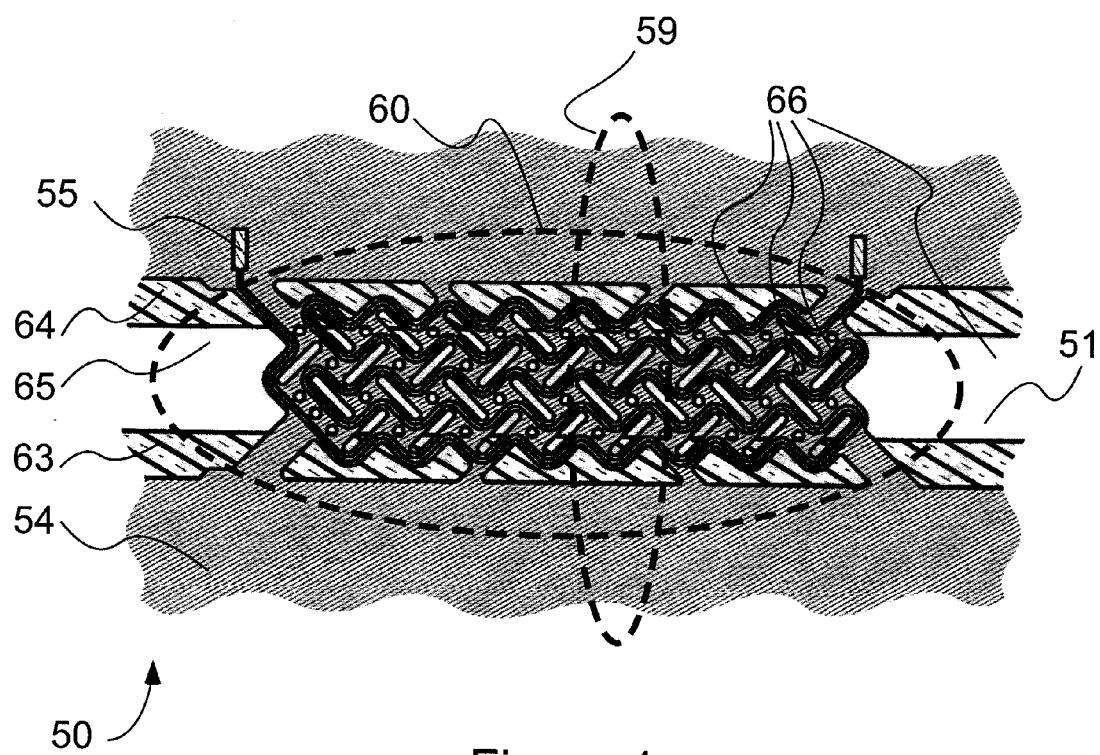
FIG. 4 is a plan view of a device according to yet another embodiment of the present invention.

FIG. 4 is a top view of portions of a device 50 according to another embodiment of the invention. Element 55 is analogous to element 35 discussed above with reference to FIG. 3, while compressive layer 54 is analogous to layer 34 of FIG. 3, and substrate 51 is analogous to substrate 31 of layer 32. Several layers are present in device 50 but not illustrated in FIG. 4. These layers are compressive layer 52, tensile layer 53, compressive layer 56, tensile layer 57, and compressive layer 58. These layers are analogous to layers 32, 33, 36, 37, and 38 respectively in device 30 of FIG. 3. Layers 52 and 53 are hidden beneath compressive layer 54 in the view shown in FIG. 4, while layers 56, 57, and 58 are not shown in order to display element 55 atop layer 54. Thin film 59 comprises layers 52, 53, 52, 56, 57, and 58. Device 50 is suitable for a sensor that detects the thermal conductivity of gas leaving a column in a gas chromatograph. In a typical gas chromatograph, the sensor must operate at a temperature of 400° C. or greater. The thin film in which element 55 is embedded is typically deposited on a silicon substrate at a temperature of 450° C. The device is operated at a substrate temperature as high as 400° C. or higher, while the element 55 may be heated by applied electrical current flowing through it, and may be operated at a temperature as high as 500° C. or higher. Hence, device 50 is an example of a device in which the thin film must survive cooling from 450° C. to room temperature plus operation at a temperature that is significantly greater than the temperature at which the thin film was formed.

Multiple holes 66 extend through thin film layer 59 into a cavity bounded by sloping sidewalls 63 and 64 and flat floor 65. During fabrication of a device according to this embodiment, an etchant such as aqueous potassium hydroxide passes through these holes to access and chemically etch the underlying substrate 51. This etching process forms the cavity undercutting the film 59 in the region of suspended bridge 60. Embedded element 55 is a thin film resistor in the form of a narrow curvilinear strip that avoids holes 66 and is accessed at its ends by contact holes, not shown, extending through layers 56, 57, and 58 where those layers overlie the ends of element 55, the contact holes allowing thin film metallization, not shown, to electrically contact the resistor ends. Rounded edges of holes 66 and element 55 avoid providing stress riser regions in the fabricated structure. The particular arrangement of holes 66 and element 55 shown in FIG. 4 allows for particularly efficient etching and undercutting in the formation of the suspended bridge 60.

The methods by which a thin film according to the present invention is formed will now be discussed in more detail.

Thin films are formed in some state of intrinsic stress at their formation temperatures, the intrinsic stress being either tensile or compressive. For many methods of film formation, the intrinsic stress has a controllable magnitude, for example in the neighborhood of 200 MPa. As the film goes to temperatures above or below its formation temperature, thermal stress is introduced by the mismatch in CTE between the thin film and the substrate on which it is grown. The intrinsic stress plus the thermal stress sum to a total stress in the absence of any other applied stresses.

If plasma assisted chemical vapor deposition (PECVD), for example, is used to form a layer of silicon nitride, the appropriate choice of deposition parameters such as the radio frequency (RF) value used in the deposition can determine the intrinsic stress. See, for example, plasmatherm.com/pdfs/papers/34.%20Stress%20Control%20of%20Si-based%20PECVD%20Dielectrics.pdf, "STRESS CONTROL OF Si-BASED PECVD DIELECTRICS", Proc. Symp. Silicon Nitride and Silicon Dioxide Thin Insulating Films & Other Emerging Dielectrics VIII, PV2005-01, 148-159, Electrochemical Society, Pennington, N.J. (2005). If low-pressure chemical vapor deposition (LPCVD) is used, the appropriate choice of deposition parameters such as the chemical ratios used in the deposition can determine the intrinsic stress. See, for example, dx.doi.org/10.1016/S0924-4247(96)01397-0, "Optimization of a low-stress silicon nitride process for surface-micromachining applications", Sensors and Actuators A: Physical, Volume 58, Issue 2, 28 Feb. 1997, Pages 149-157.

For purposes of illustration, first consider a bridge structure built without using the methods of the present invention. Consider that silicon has a CTE of nominally 3.7 parts per million per degree Kelvin ($CTE_{Si}$=3.7 ppm/K) over a given temperature range, while silicon nitride has a CTE of $CTE_{nitride}$=3.3 ppm/K over the same temperature range. If PECVD nitride is deposited on a silicon substrate at, for example, 450° C., with an intrinsic tensile stress of 200 MPa, and then the film and substrate are cooled to T=25° C., the silicon substrate shrinks during cooling by a greater amount than the PECVD nitride film would shrink if it were unconstrained. Hence, the remaining stress in the film at room temperature is less than 200 MPa. If a cavity is then etched into the substrate beneath the nitride film, the result can be a bridge supported at two ends, the bridge being in tension. However, because the surfaces of the nitride film in the bridge structure are also in tension, the bridge will tend to break easily near any surface defects in the film because surface defects tend to act as stress-riser points.

Breakage of the bridge structure can be avoided by using, instead, the methods and structures of the present invention. As an example, a composite thin film is formed as follows. A first layer of PECVD nitride 0.15 micrometers (0.15 μm) thick, having a compressive stress of −200 MPa, is first deposited on a surface of a silicon substrate at 450° C. Then a second layer of PECVD nitride 0.4 μm thick, having a tensile stress of 200 MPa, is deposited atop the first layer at the same 450° C. temperature. Then a third layer of PECVD nitride 0.15 μm thick, having a compressive stress of −200 MPa, is deposited atop the second layer at the same 450° C. temperature. The composite thin film comprising three layers, and the substrate, are cooled to room temperature. Next, the lateral extents of a beam structure are defined by means of photolithography followed by plasma etching through the thicknesses of all three nitride layers, the plasma etching exposing a region of the surface of the silicon substrate which can then be attacked via chemical etching to create a cavity extending under the bridge structure, leaving a bridge structure extending between two edges of the cavity. The bridge structure exerts a net tensile force on the substrate at its two supporting ends, and the central layer of the bridge comprising the tensile second layer of nitride is in tension, but the two surface regions of the bridge comprising the compressive first and third layers are in compression, reducing any tendency of the bridge to break because any defects at the exposed surfaces of the structure are in compression. It will be appreciated that, for the example described here, the net tensile force exerted by the bridge is roughly the same as that which would be exerted by a tensile nitride layer only 0.1 μm thick, that thickness being the thickness left if the two compressive layer thicknesses of 0.15 μm of the first and third layers are subtracted from the tensile layer thickness of 0.4 μm of the second layer.

If the bridge structure of the present example is taken to temperatures above the 450° C. formation temperature of the composite thin film, the substrate will exert an increasingly tensile force on the bridge, until at some temperature the bridge will experience breakage, but that breakage temperature will be higher than that which would occur if tensile stress were present at the surfaces of the bridge at the film formation temperature.

Further, if the bridge structure of the present example is taken to temperatures below the room temperature, the substrate will exert a decreasingly tensile force on the bridge and then may exert compressive force on the bridge, until at some temperature the bridge will experience buckling which may cause breakage, but that buckling temperature will be lower than that which would occur if no tensile stress were present within the second nitride layer at its formation temperature.

Thus, the methods and structures of the present invention can provide survival at both higher temperature and lower temperature than those obtainable without the present invention, and can provide survival over a wider total range of temperature than that obtainable without the present invention. Furthermore, an additional element such as an electrical resistor can be incorporated into the composite thin film, thereby being encased by the film for purposes such as environmental passivation, while retaining the advantage of the composite thin film of survival over an extended temperature range.

The present invention provides an improved temperature range by utilizing at least two layers of a multilayer film that are created with compressive intrinsic stress and at least one layer of the multilayer film positioned between those two layers having tensile intrinsic stress. This approach provides a thin film that will function over an increased range of temperatures characterized by upper and lower temperature limits. By tuning both the tensile and compressive stresses, and the thickness of each layer, it is possible to achieve a net force, in a bridge structure utilizing the film, that varies from being mildly tensile to mildly compressive at room temperature and below, to the lower limit of the desired temperature range, while preventing excessive tensile stress at high temperatures, to the upper limit of the desired temperature range. At low temperatures, the net state of force in the structure acts to prevent buckling. At high temperatures, where the higher CTE of the substrate relative to the thin film creates additional tensile stress in the thin film, intrinsic compressive stresses in the surfaces of the film act to prevent film rupture.

Microstructures having thin films fabricated according to the present invention therefore survive with increased reliability over a larger temperature range in comparison to prior art microstructures.

It will be appreciated that the principles of survival via the presence of surface compression in thin films, illustrated in the above example can be extended to different layer thicknesses, different stress levels, and different materials. The thickness used for a compressive layer can in practice be 0.05 μm or less, and can be 0.5 μm or greater. The thickness used for a tensile layer can be 0.1 μm or less, and can be 1 μm or greater. The tensile stress in a tensile layer can be as little as zero, as high as 600 MPa, or higher. The compressive stress in a compressive layer can be as little as zero, as large as 600 MPa, or higher in magnitude. The thin film may be as thick as 5 μm or greater.

A method 70 of forming a device according to an embodiment of the present invention, such as device 10 shown in FIG. 1, is illustrated in FIG. 5. Method 70 begins with step 71, in which a first layer 13 of thin film 16 is deposited upon a surface of substrate 11, layer 13 having a compressive intrinsic stress. At step 72 a second layer 14 of thin film 16 is deposited to overlay first layer 13, layer 14 having a tensile intrinsic stress. At step 73, third layer 15 of thin film 16 is deposited to overlay second layer 14, layer 15 having a compressive intrinsic stress. At step 74, the lateral extents of bridge structure 17 are defined by means of photolithography and etching to expose regions of the surface of substrate 11 which can be attacked in step 75 by etching, for example etching in an aqueous solution of hot potassium hydroxide, to form cavity 12 beneath the thin film 16 to leave bridge structure 17 suspended at two ends. The overall CTE of thin film 16, which includes layers 13, 14, and 15, is different from the CTE of the substrate 11. It will be appreciated that layers 13, 14, and 15 may each be the same type of material, such as PECVD silicon nitride, or may be different types of materials, for example some combination of PECVD silicon nitride and LPCVD silicon nitride, or for example silicon dioxide and silicon nitride. It will be further appreciated that good design makes it desirable for the stresses in layers 13, 14, and 15 to be balanced, as much as possible, in such a manner that the thin film 16 comprising bridge structure 17 has little or no tendency to curl either upward or downward.

As noted above, the state of tension of a layer deposited using plasma assisted chemical vapor deposition processes can be adjusted by varying the radio frequency used to form the plasma, thereby forming first a compressive layer 13, then a tensile layer 14, then a compressive layer 15. If a low-pressure chemical vapor deposition process is used to deposit the film layers, the state of tension may be adjusted by tuning the ratios of reactant gases, thereby forming first a layer in a state of compression, then a layer in a state of tension, and then another layer in a state of compression.

Optionally, additional steps can be added to the method 70 described above. For example, the formation a thin film element can be added between steps 71 and 72, or between steps 72 and 73, or thin film elements can be formed both between steps 71 and 72 and between steps 72 and 73, or a thin film element can be formed atop layer 15 after step 73. Many variations on the above method will occur to practitioners without departing from the spirit and scope of the present invention.

Refer again to FIG. 2. Device 20 is fabricated by successive formations of a compressive layer 23, a tensile layer 24, and by formation of an element 25 of material composition distinct from the materials layers 23 and 24. Another tensile layer 26 and another compressive layer 27 are then formed, the layers 23, 24, 26, and 27 forming composite thin film 28. The thin film 28 is then patterned to form a microstructure 29 of limited lateral extent in such a manner as to expose the substrate. The substrate is then etched to form a cavity 22 in the substrate beneath the microstructure 29.

Figure 6:
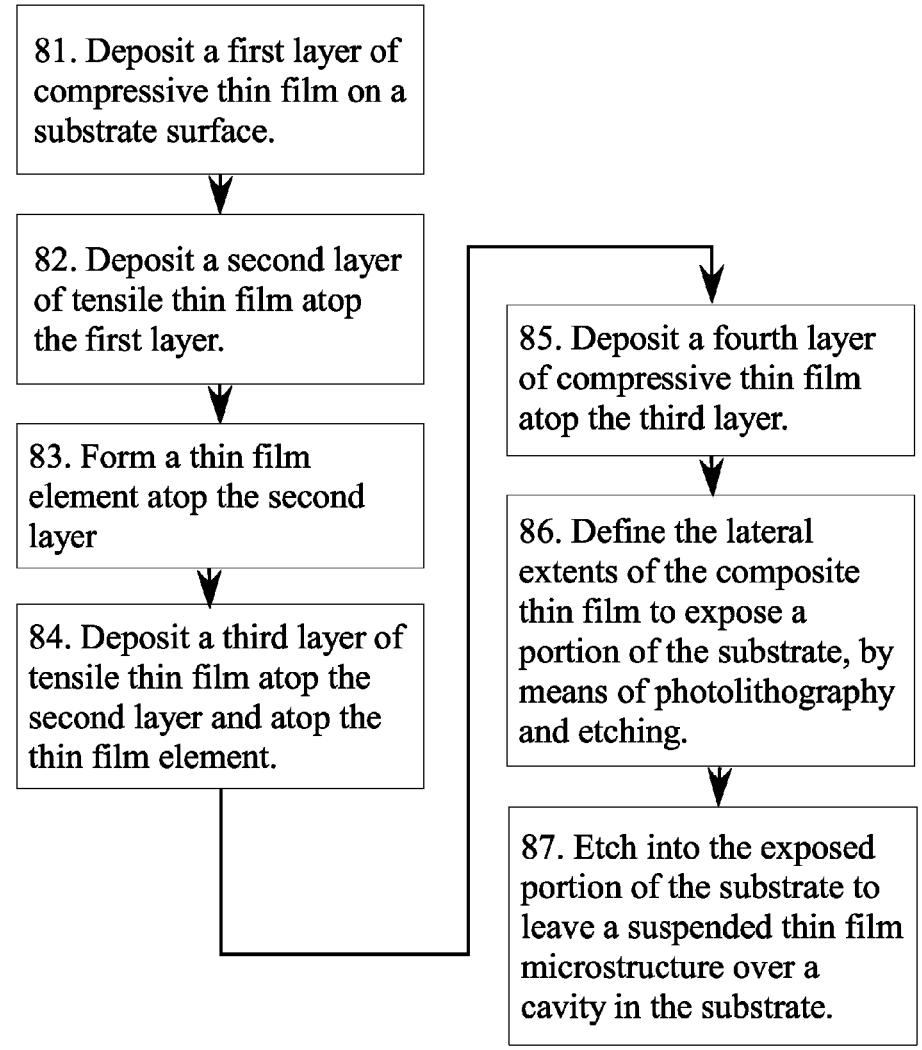
FIG. 6 illustrates a method of fabrication of an embodiment of the invention.

FIG. 6 illustrates a method for fabricating such a device. Method 80 includes a compressive layer deposition step 81, and first and second tensile deposition steps 82 and 84. Method 80 continues with compressive layer deposition step 85 and patterning and etching steps 86 and 87. An optional step 83 may be carried out between steps 82 and 84, to form another thin film element on top of tensile layer 24 using at least one of deposition, patterning, and etching.

In one embodiment, the method of forming the device may include forming a second thin film on top of the first thin film. The second thin film is formed in essentially the same way as the first thin film, having first and third layers in states of compression, and a second layer, lying between those first and third layers, in tension. An example of a device formed by this method is shown in FIG. 3, in which layers 32, 33 and 34 make up the first thin film and layers 36, 37, and 38 make up the second thin film.

Figure 7:
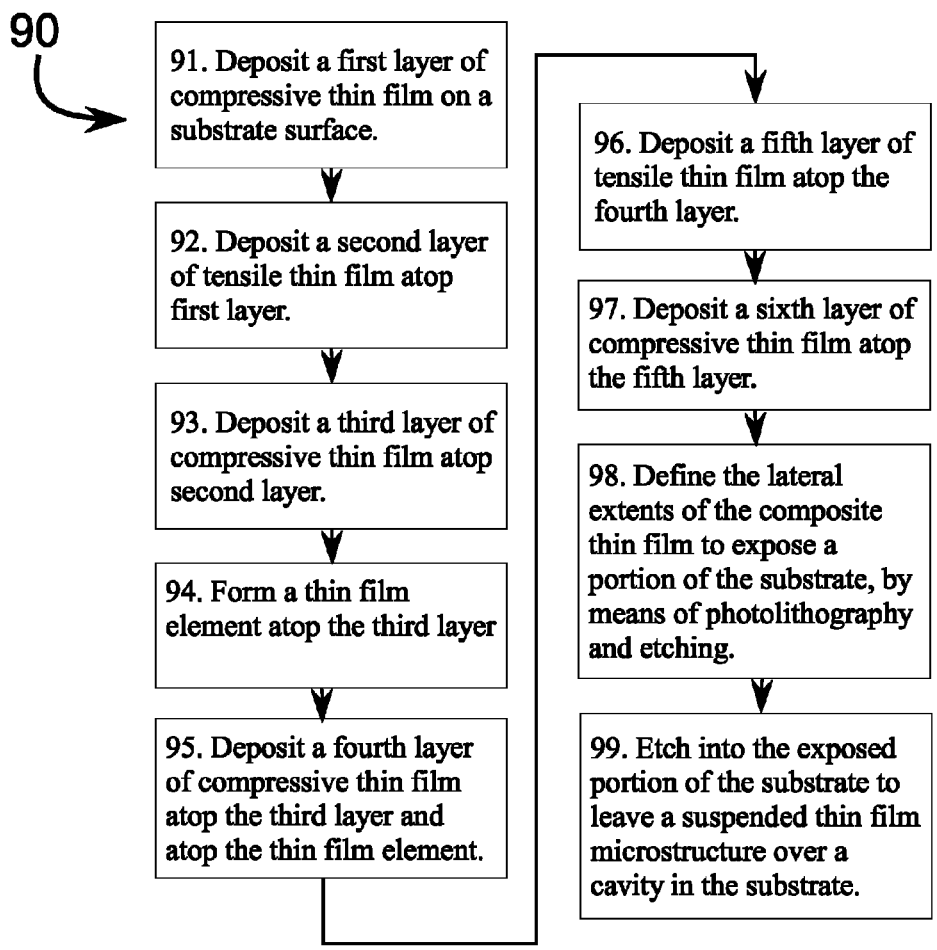
FIG. 7 illustrates a method of fabrication of an embodiment of the invention.

FIG. 7 illustrates a method for fabricating such a device and may be discussed with reference to the device 30 shown in FIG. 3. Method 90 comprises step 91 wherein a first compressive layer 32 is formed, step 92 wherein a tensile layer 33 is formed, step 93 wherein a compressive layer 34 is formed, step 94 wherein a thin film element 35 is formed, step 95 wherein a compressive layers 36 is formed, step 96 wherein a tensile layer 37 is formed, step 97 wherein a compressive layer 38 is formed, step 98 wherein the lateral extents of structure 40 are defined, and step 99 wherein cavity 42 is formed in substrate 31 beneath structure 40.

As noted above, a thin film according to the present invention is typically less than 5 μm in thickness. In one aspect of the invention, the thin film is less than 4 μm, less than 3 μm, less than 2 μm, or less than 1 μm.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A device comprising:
   a substrate characterized by a first coefficient of thermal expansion (CTE), the substrate having a surface; and
   a thin film attached to the surface, the thin film characterized by a second CTE different from the first CTE; the thin film comprising:
   first and second layers in states of compression; and
   a third layer in a state of tension, the third layer being positioned between the first and second layers;
   wherein the thin film exerts a net tensile force on the substrate over a temperature range.

2. The device of claim 1 wherein the temperature range is chosen from the group consisting of 100° C. to 400° C., 100° C. to 500° C., 25° C. to 400° C., 25° C. to 500° C., 0° C. to 400° C., 0° C. to 500° C., −50° C. to 400° C., −50° C. to 500° C., −55° C. to 400° C., −55° C. to 500° C., −80° C. to 400° C., and −80° C. to 500° C.

3. The device of claim 1 wherein each layer of the thin film comprises a material chosen from the group consisting of silicon nitride, plasma-enhanced chemical vapor deposited silicon nitride, low pressure chemical vapor deposited silicon nitride, plasma-enhanced chemical vapor deposited silicon dioxide, thermally grown silicon dioxide, and TEOS silicon dioxide, the same material being chosen for each layer.

4. The device of claim 1 wherein the thin film comprises a structure suspended over a cavity in the surface.

5. The device of claim 4 wherein the structure comprises a cantilever attached to one edge of the cavity, a bridge attached to two edges of the cavity, or a diaphragm attached at two or more edges of the cavity.

6. The device of claim 4, wherein the structure comprises an element disposed between two of the first, second, and third layers, and within one of the first, second, and third layers, the element having a composition different from the first, second, and third layers.

7. The device of claim 6 wherein the element comprises a material chosen from the group consisting of nickel, tungsten, titanium, permalloy, and platinum.

8. The device of claim 6 wherein the element comprises a thin film resistor.

9. The device of claim 8 wherein the device comprises a conductivity sensor that includes the thin film resistor, wherein the structure is formed on the substrate at a formation temperature and wherein the conductivity sensor operates at a temperature at least 100° C. above the formation temperature.

10. A method of forming a device comprising a substrate and a first thin film, the method comprising:
forming a first layer of the first thin film upon a surface of the substrate, the substrate characterized by a first CTE,
forming a second layer of the first thin film, the second layer overlying the first layer; and
forming a third layer of the first thin film, the third layer overlying the second layer;
wherein the first thin film is characterized by a second overall CTE different from the first CTE; and
wherein the first and third layers of the first thin film are in states of compression and the second layer of the first thin film is in a state of tension, the states of compression and tension of the first thin film causing the first thin film to be in a net state of tension within a temperature range.

11. The method of claim 10, wherein the temperature range is chosen from the group consisting of 100° C. to 400° C., 100° C. to 500° C., 25° C. to 400° C., 25° C. to 500° C., 0° C. to 400° C., 0° C. to 500° C., −50° C. to 400° C., −50° C. to 500° C., −55° C. to 400° C., −55° C. to 500° C., −80° C. to 400° C., and −80° C. to 500° C.

12. The method of claim 10, wherein the first thin film is defined by patterning and etching to form a structure of limited lateral extent on the surface of the substrate, and wherein the surface of the substrate is removed from beneath the structure by etching to leave the structure suspended over a cavity in the surface of the substrate.

13. The method of claim 10, wherein an element having a composition different from the first, second, and third layers is formed within the first thin film.

14. The method of claim 13 wherein the element comprises a material chosen from the group consisting of nickel, tungsten, titanium, permalloy, and platinum.

15. The method of claim 10, further comprising forming a second thin film characterized by a third CTE different from the first CTE atop the first thin film, the second thin film being formed by:
forming a first layer of the second thin film on the first thin film;
forming a second layer of the second thin film, the second layer of the second thin film overlying the first layer of the second thin film; and
forming a third layer of the second thin film, the third layer of the second thin film overlying the second layer of the second thin film;
wherein the first and third layers of the second thin film are in states of compression;
wherein the second layer of the second thin film is in a state of tension; and
wherein the states of compression and tension of the second thin film cause the second thin film to be in a net state of tension through the temperature range.

16. The method of claim 15, wherein the second thin film and the first thin film are defined by patterning and etching to form a structure of limited lateral extent on the surface of the substrate, and wherein the surface of the substrate is removed from beneath the structure by etching to leave the structure suspended over a cavity in the surface of the substrate.

17. The method of claim 15, wherein an element having a composition different from the first and second thin films is formed between the first thin film and the second thin film.

18. A method of forming a suspended microstructure, comprising:
forming a first layer of a thin film atop a surface of a substrate, the first layer being in a state of compression;
forming a second layer of the thin film atop the first layer, the second layer being in a state of tension;
forming an element atop the second layer, the element comprising a material distinct from any of the materials comprised within the first and second layers;
forming a third layer of the thin film atop the second layer and atop the element, the third layer being in a state of tension;
forming a fourth layer of the thin film atop the third layer, the fourth layer being in a state of compression;
patterning the first, second, third, and fourth layers to form a microstructure of limited lateral extent in such a manner as to expose portions of the substrate; and
etching the substrate to form a cavity in the substrate beneath the suspended microstructure;
wherein the substrate is characterized by a first CTE and the thin film is characterized by a second overall CTE different from the first CTE.

19. The method of claim 18 wherein the thin film comprises one of silicon nitride, plasma enhanced chemical vapor deposited silicon nitride, low pressure chemical vapor deposited silicon nitride, plasma enhanced chemical vapor deposited silicon dioxide, thermally grown silicon dioxide, and TEOS silicon dioxide.

20. The method of claim 18 wherein the element comprises a thin film resistor comprising a material chosen from the group consisting of nickel, tungsten, titanium, permalloy and platinum.

* * * * *